(12) United States Patent
Chiang et al.

(10) Patent No.: US 12,176,222 B2
(45) Date of Patent: Dec. 24, 2024

(54) SEMICONDUCTOR PACKAGE WITH METAL POSTS FROM STRUCTURED LEADFRAME

(71) Applicant: Infineon Technologies AG, Neubiberg (DE)

(72) Inventors: Chau Fatt Chiang, Melaka (MY); Thorsten Meyer, Regensburg (DE); Chan Lam Cha, Melaka (MY); Wern Ken Daryl Wee, Melaka (MY); Chee Hong Lee, Melaka (MY); Swee Kah Lee, Melaka (MY); Norliza Morban, Melaka (MY); Khay Chwan Andrew Saw, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 116 days.

(21) Appl. No.: 17/536,538

(22) Filed: Nov. 29, 2021

(65) Prior Publication Data

US 2023/0170226 A1 Jun. 1, 2023

(51) Int. Cl.
*H01L 21/48* (2006.01)
*H01L 21/56* (2006.01)
(Continued)

(52) U.S. Cl.
CPC ........ *H01L 21/4853* (2013.01); *H01L 21/568* (2013.01); *H01L 23/31* (2013.01);
(Continued)

(58) Field of Classification Search
CPC ............... H01L 21/4853; H01L 21/568; H01L 23/31; H01L 23/367; H01L 23/49811;
(Continued)

(56) References Cited

U.S. PATENT DOCUMENTS

| 6,563,209 B1 | 5/2003 | Takahashi |
| 9,269,595 B2 * | 2/2016 | Chi .......................... H01L 24/94 |
| 2009/0236135 A1 * | 9/2009 | Ueda .................... H05K 3/4682 |
| | | 216/13 |

(Continued)

FOREIGN PATENT DOCUMENTS

| DE | 102021113069 A1 | 11/2021 |
| DE | 102020108851 B4 | 3/2023 |

OTHER PUBLICATIONS

Chiang, Chau Fatt, "Semiconductor Package with Lead Tip Inspection Feature", U.S. Appl. No. 16/882,008, filed May 22, 2020, 1-29.
Saw, Khay Chwan, et al., "Chip to Chip Interconnect in Encapsulant of Molded Semiconductor Package", U.S. Appl. No. 17/412,787, filed Aug. 26, 2021, 1-25.

*Primary Examiner* — Timor Karimy
(74) *Attorney, Agent, or Firm* — Murphy, Bilak & Homiller, PLLC

(57) ABSTRACT

A method of forming a semiconductor package includes providing a metal baseplate having a base section and a plurality of metal posts, the base section being a planar pad of substantially uniform thickness, the plurality of metal posts each extending up from a planar upper surface of the base section, mounting a semiconductor die on the upper surface of the metal baseplate, forming an encapsulant body of electrically insulating mold compound on the upper surface of the base section, electrically connecting terminals of the semiconductor die to the metal posts, and removing the base section so as to form package contacts from the metal posts at a first surface of the encapsulant body.

20 Claims, 18 Drawing Sheets

(51) Int. Cl.
*H01L 23/31* (2006.01)
*H01L 23/367* (2006.01)
*H01L 23/498* (2006.01)
*H01L 25/00* (2006.01)
*H01L 25/18* (2023.01)

(52) U.S. Cl.
CPC ...... *H01L 23/367* (2013.01); *H01L 23/49811* (2013.01); *H01L 25/18* (2013.01); *H01L 25/50* (2013.01)

(58) Field of Classification Search
CPC ......... H01L 25/81; H01L 25/50; H10B 80/00; H10K 19/00; H10K 39/00; H10K 59/90; H10K 59/95; H10K 65/00; H10N 19/00; H10N 39/00; H10N 59/00; H10N 69/00; H10N 79/00; H10N 89/00
See application file for complete search history.

(56) References Cited

U.S. PATENT DOCUMENTS

| | | |
|---|---|---|
| 2010/0144101 A1* | 6/2010 | Chow .................. H01L 21/568 257/E21.502 |
| 2010/0244216 A1 | 9/2010 | Huang et al. |
| 2012/0086117 A1 | 4/2012 | Chang et al. |
| 2014/0070329 A1 | 3/2014 | Flores et al. |
| 2014/0124928 A1 | 5/2014 | Lin et al. |
| 2015/0187695 A1 | 7/2015 | Yu et al. |
| 2015/0279778 A1 | 10/2015 | Camacho et al. |
| 2016/0099201 A1 | 4/2016 | Choi et al. |
| 2017/0033036 A1 | 2/2017 | Kajihara et al. |
| 2017/0229436 A1 | 8/2017 | Yu et al. |
| 2017/0256509 A1* | 9/2017 | Lee .................. H01L 23/49503 |
| 2018/0151521 A1 | 5/2018 | Lee et al. |
| 2019/0110361 A1* | 4/2019 | Abe ..................... H05K 1/028 |
| 2020/0185293 A1 | 6/2020 | Schmalzl et al. |
| 2020/0211934 A1 | 7/2020 | Ko |
| 2020/0350222 A1* | 11/2020 | Danny Koh ............ H01L 25/50 |

* cited by examiner

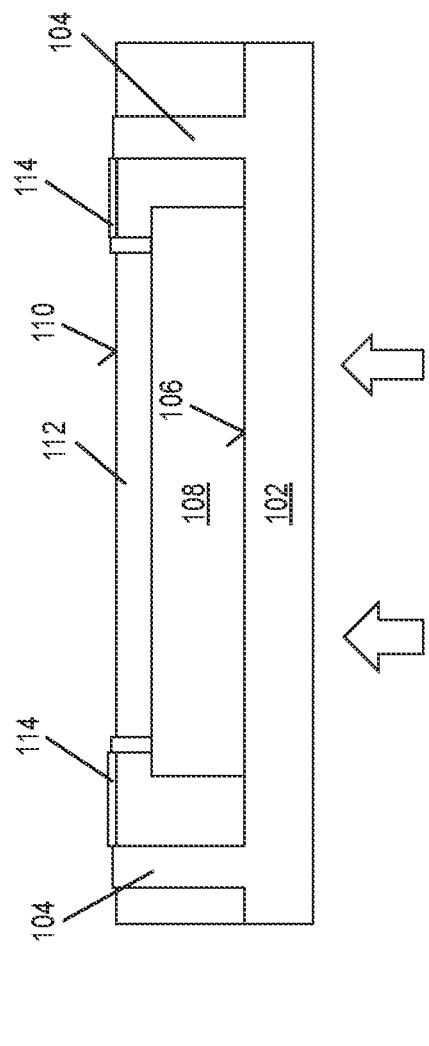
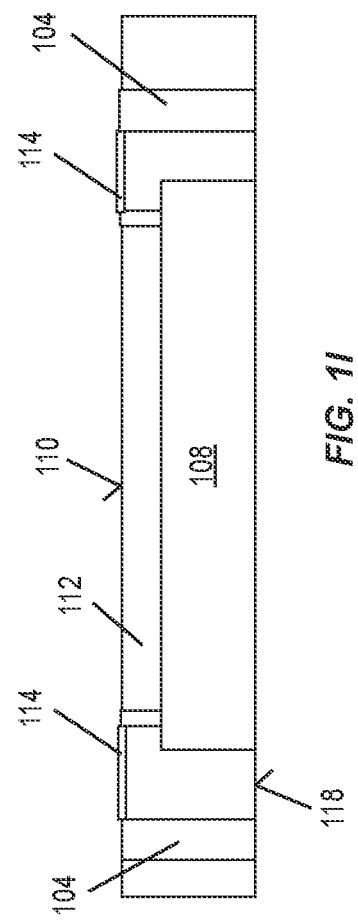

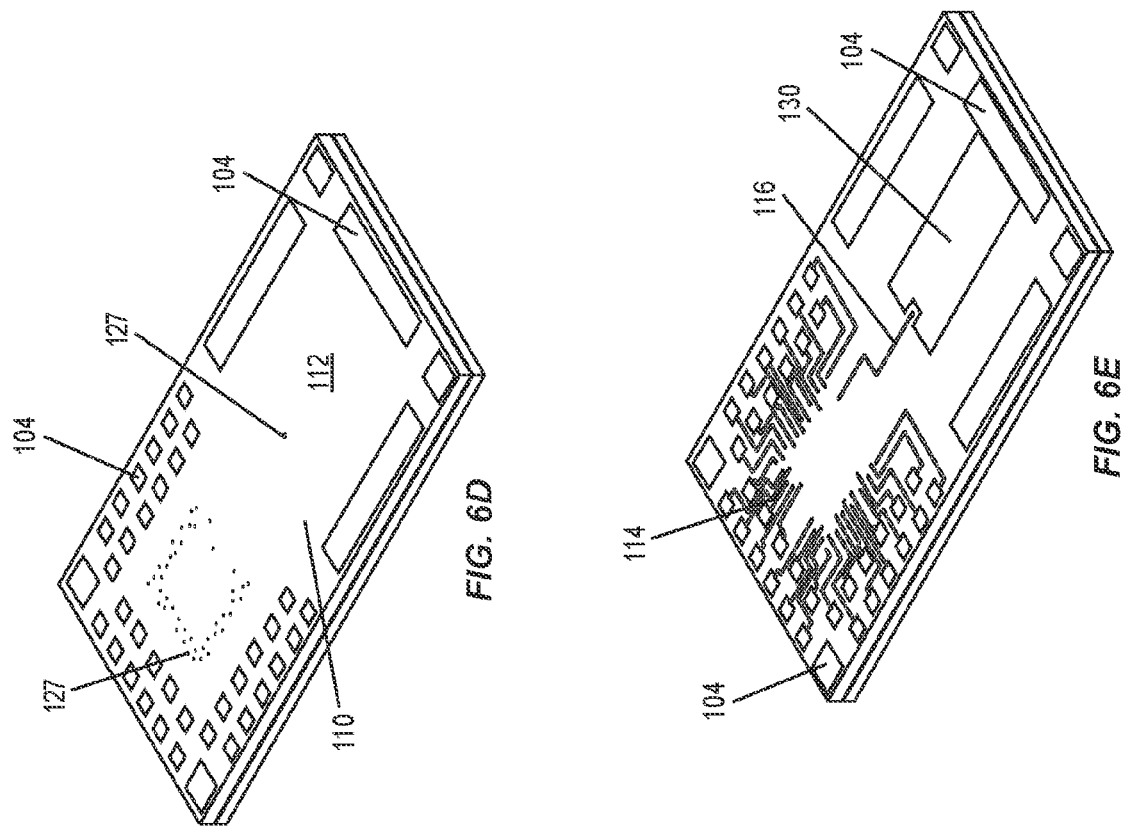
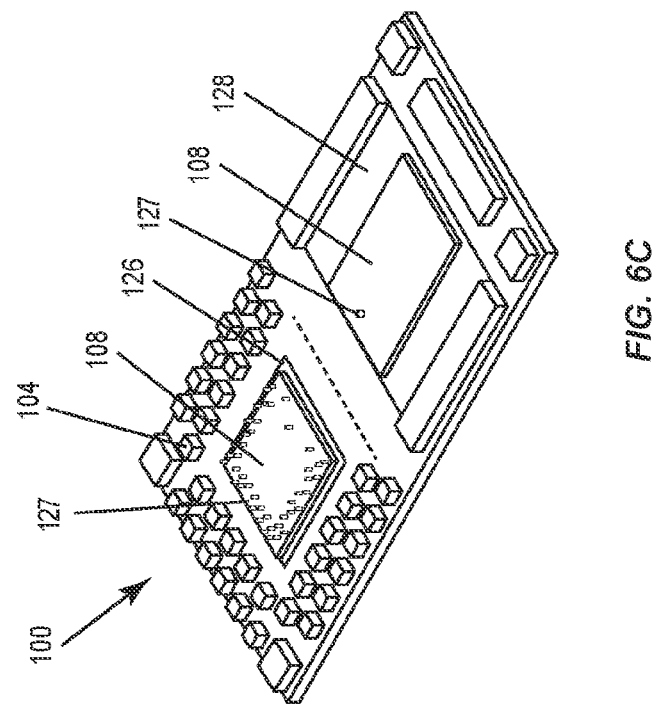

SEMICONDUCTOR PACKAGE WITH METAL POSTS FROM STRUCTURED LEADFRAME

TECHNICAL FIELD

The instant application relates to semiconductor devices, and in particular relates to methods of forming semiconductor packages and corresponding semiconductor packages.

BACKGROUND

Many types of semiconductor devices are highly sensitive to parasitic electrical effects such as parasitic interconnect resistance and inductance, parasitic capacitive coupling, etc. For example, switches, RF (radio frequency) power amplifiers, low-noise amplifiers (LNAs), antenna tuners, mixers, etc. are each highly sensitive to parasitic electrical effects. Techniques for reducing parasitic electrical effects on a packaged semiconductor device often result in higher overall cost, larger package size, more complex manufacturing process, reduced device performance, etc.

SUMMARY

A method of forming a semiconductor package is disclosed. According to an embodiment, the method comprises providing a metal baseplate comprising a base section and a plurality of metal posts, the base section being a planar pad of substantially uniform thickness, the plurality of metal posts each extending up from a planar upper surface of the base section, mounting a semiconductor die on the upper surface of the metal baseplate, forming an encapsulant body of electrically insulating mold compound on the upper surface of the base section, electrically connecting terminals of the semiconductor die to the metal posts, and removing the base section so as to form package contacts from the metal posts at a first surface of the encapsulant body.

Separately or in combination, the package contacts comprise ends of the ends of the metal posts that exposed at one or both of the first surface of the encapsulant body and a second surface of the encapsulant bod, the second surface being opposite from the first surface.

Separately or in combination, removing the base section comprises and one or more of: chemical etching, mechanical grinding, milling, or lasering.

Separately or in combination, the semiconductor die is mounted with at least some of the terminals facing away from the metal baseplate, and wherein electrically connecting terminals of the semiconductor die to the metal posts comprises providing conductive pillars on the terminals of the semiconductor die that face away from the base plate before forming the encapsulant body, exposing upper ends of the conductive pillars at a second surface of the encapsulant body after forming the encapsulant body; and forming conductive tracks in the second surface of the encapsulant body.

Separately or in combination, the method further comprises covering the conductive tracks with a solder resist material.

Separately or in combination, the electrically insulating mold compound comprises a laser-activatable mold compound, and wherein the forming conductive tracks comprises applying a laser to the second surface of the encapsulant body thereby forming a laser activated traces in the second surface of the encapsulant body, and performing a plating process that selectively forms the conductive tracks in the laser activated traces.

Separately or in combination, performing the plating process comprises performing an electroless plating process that forms seed layer parts of the conductive tracks, and performing an electroplating process that forms thicker metal layer parts of the conductive tracks on top of the seed layer parts, the thicker metal layer being thicker than the seed layer parts, and wherein the base section of the metal baseplate remains intact during the electroplating process.

Separately or in combination, forming conductive tracks comprises laser assisted metal deposition, or ink jet metal printing.

Separately or in combination, the method further comprises providing a first pad in a first area of the upper surface of the base section, providing second pad in a second area of the upper surface of the base section, the second pad comprising metal, mounting the semiconductor die on the first pad, and mounting a second semiconductor die on the second pad, wherein after removing the base section the metal pad is exposed from the first surface of the encapsulant body and forms a thermal conduction path between an outer surface of the semiconductor package and the second semiconductor die.

Separately or in combination, the first pad is an electrically insulating structure.

Separately or in combination, is an electrically conductive structure.

Separately or in combination, the semiconductor die is a logic device, the second semiconductor die is a power switching device, and the method further comprises electrically connecting a terminal of the semiconductor die to a terminal of the second semiconductor die.

Separately or in combination, the metal baseplate is provided to comprise a metal trace on the upper surface of the base section, and wherein the metal trace contacts the metal posts.

Separately or in combination, the metal baseplate is provided to comprise a die attach area on the upper surface of the metal baseplate, wherein the at least one metal trace extends between the die attach area and the metal posts, and wherein the semiconductor die is mounted on the die attach area such one of the terminals of the semiconductor die faces and electrically connects with the metal trace.

Separately or in combination, the metal trace is connected between a first one of the metal posts and a second one of the metal posts, wherein electrically connecting terminals of the semiconductor die to the metal posts comprise forming a conductive track in a second surface of the encapsulant body that is opposite from the first surface of the encapsulant body, and wherein the conductive track electrically connects one of the terminals of the semiconductor to the first one of the metal posts.

Separately or in combination, the method further comprises forming a lead tip inspection feature of the semiconductor package, wherein forming the lead tip inspection feature comprises structuring the encapsulant body to form an exposed sidewall of one of the metal posts, wherein the exposed sidewall extends completely between the first surface of the encapsulant body and a second surface of the encapsulant body that is opposite from the first surface.

Separately or in combination, forming the lead tip inspection feature further comprises structuring the encapsulant body form a second exposed sidewall of the one of the metal posts, wherein the second exposed sidewall extends completely between the first and second surfaces of the encapsulant body, and wherein the first and second exposed sidewalls form an angled intersection with one another.

Separately or in combination, the method further comprises providing a first pad that is electrically conductive on the upper surface of the base section, the first pad comprising a main pad portion and connectors that extend between the metal pad portion and at least one of the metal posts, and mounting the semiconductor die on the first pad such that at least one of the terminals of the semiconductor die faces and is electrically connected to the main pad portion.

Separately or in combination, forming the electrical interconnects comprises a metal structuring process that is performed after forming the encapsulant body.

A semiconductor package is disclosed. According to an embodiment, the semiconductor package comprises a semiconductor die, an encapsulant body of electrically insulating mold compound encapsulating the semiconductor die, a plurality of metal posts extending between a second surface of the encapsulant body and first surface of the encapsulant body that is opposite from the second surface of the encapsulant body, and electrical connections between terminals of the semiconductor die and the metal posts, wherein ends of the metal posts that are exposed from the second surface or the first surface of the encapsulant body form package contacts of the semiconductor package.

Separately or in combination, the encapsulant body comprises a laser-activatable mold compound, and wherein at least some of the electrical interconnects between comprise conductive tracks that are formed in the second surface of the encapsulant body.

Separately or in combination, the conductive tracks comprise thinner seed layer parts and thicker parts on top of the thinner seed layer parts, wherein a thickness of the thinner seed layer parts is no greater than 1 μm, and wherein a thickness of the thicker parts is at least 5 μm.

Separately or in combination, the semiconductor package further comprises an electrically insulating pad in a first area of the semiconductor package, and a metal pad in a second area of the semiconductor package; wherein the semiconductor die is mounted on the electrically insulating pad such that the semiconductor die is electrically isolated from an outer surface of the semiconductor package by the electrically insulating pad, wherein the semiconductor package further comprises a second semiconductor die mounted on the metal pad, wherein the metal pad is exposed from the encapsulant body at the first surface and forms a thermal conduction path between an outer surface of the semiconductor package and the second semiconductor die.

Separately or in combination, the semiconductor package further comprises a lead tip inspection feature, wherein the lead tip inspection feature comprises an exposed sidewall of one of the metal posts that is exposed from the encapsulant body, wherein the exposed sidewall extends completely between the first and second surfaces of the encapsulant body.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A-1I, illustrates selected steps in a method of forming a semiconductor package, according to an embodiment.

FIG. 2, which includes FIG. 2A depicts an isometric view of a second surface of the encapsulant body of the semiconductor package; and FIG. 2B depicts an isometric view of a first surface of the encapsulant body of the semiconductor package.

FIG. 3, which includes FIG. 3A depicts an isometric view of a second surface of the encapsulant body of the semiconductor package; and FIG. 3B depicts an isometric view of a first surface of the encapsulant body of the semiconductor package.

FIG. 4, which includes

FIG. 5, which includes FIG. 5A depicts an isometric view of a second surface of the encapsulant body of the semiconductor package; and FIG. 5B depicts an isometric view of a first surface of the encapsulant body of the semiconductor package.

FIG. 6, which includes FIGS. 6A-6G, illustrates selected steps in a method of forming a semiconductor package, according to an embodiment.

FIG. 7, which includes FIG. 7A depicts an isometric view of a first surface of the encapsulant body of the semiconductor package; and FIG. 7B depicts an isometric view of a second surface of the encapsulant body of the semiconductor package.

FIG. 8, which includes

FIG. 9, which includes

FIG. 10, which includes

FIG. 11, which includes

FIG. 12, which includes FIG. 12A depicts a lead tip inspection feature disposed at one edge side of the semiconductor package; and FIG. 12B depicts a lead tip inspection feature disposed at an intersection between two edge sides of the semiconductor package.

DETAILED DESCRIPTION

Figure 1B:
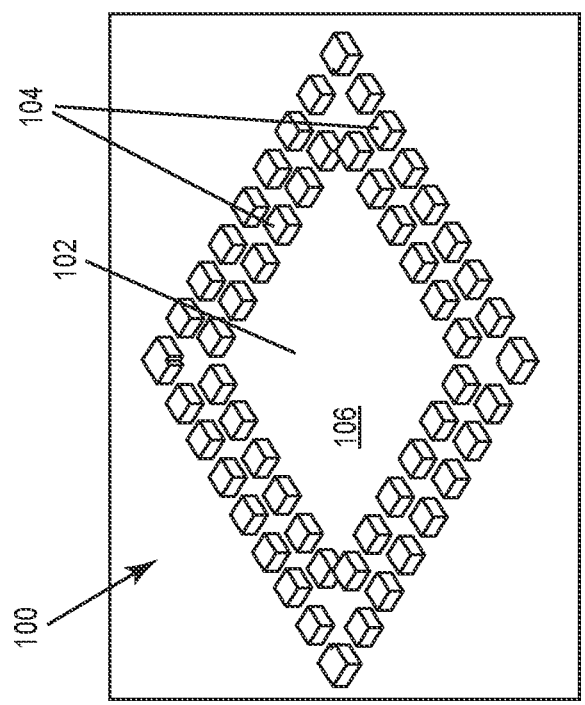
Figure 1A:
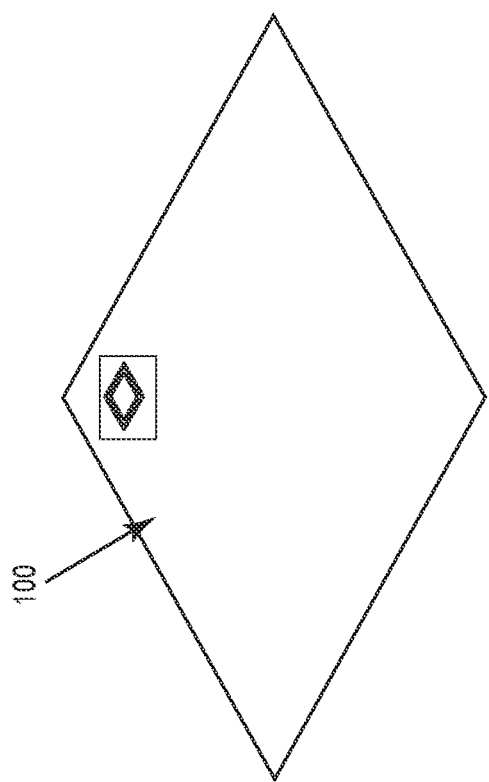

Various embodiments of a method of forming a semiconductor package from a metal baseplate are described herein. The metal baseplate comprises a base section with a planar upper surface and a plurality of metal posts that project upward from the upper surface of the base section. One or more semiconductor dies are mounted on the upper surface of the base section. The semiconductor die or dies are encapsulated with an electrically insulating material, e.g., by a molding technique. Subsequently, the metal baseplate is removed, e.g., by etching, grinding, etc., until the metal posts are detached from one another and form discrete pillars extending between opposite facing surfaces of the encapsulant body. Before or after the molding process, the terminals of the semiconductor die or dies are electrically connected to the metal posts. According to one technique, the encapsulant material comprises a plateable mold compound and the connections between the terminals of the semiconductor die and the metal posts are at least partially formed by conductive tracks formed in the outer sides of the encapsulant body. Alternatively, these electrical connections may be formed by wire bonding. In any case the outer ends of the metal posts are exposed from at least one surface of the encapsulant body, and thus form externally accessible package contacts. In this way, a semiconductor package with an electrical redistribution connection that may extend outside of the footprint of the semiconductor die minimal parasitic electrical effects at low cost and small package footprint is advantageously provided. Separately or in combination, the metal posts can advantageously form lead tip inspection features with a large exposed metal area that is easily recognized by optical inspection equipment.

Referring to FIG. 1, a method of forming a semiconductor package 101 comprises providing a metal baseplate 100. The metal baseplate 100 comprises a base section 102 and plurality of metal posts 104. The base section 102 has a substantially uniform thickness, and each of the metal posts 104 project upward from a planar upper surface 106 of the base section 102. The metal posts 104 can have a variety of different geometries, e.g., cubic, cylindrical, etc. As shown in FIG. 1B, the metal posts 104 can be formed to surround a die attach area on the upper surface 106 of the base section 102. The metal baseplate 100 comprising the base section 102 and plurality of metal posts 104 can be provided from a uniform thickness sheet of metal, e.g., as shown in FIG. 1A. This sheet of metal may comprise copper, aluminum, nickel, and alloys or combinations thereof. The structural features of the base section 102 and plurality of metal posts 104 can be created by performing any one or more metal processing techniques including, e.g., etching, grinding, stamping. According to one particular technique, a uniform thickness sheet of metal is provided, and the geometry of the base section 102 and the metal posts 104 is obtained by a half-etching technique, wherein the base section 102 corresponds to the half-etched region and the metal posts 104 correspond to the non-etched regions. FIG. 1A illustrates one package site comprising the metal posts 104 formed in a large metal sheet. The basic structure of the package site may be repeated multiple times in the large metal sheet, and the subsequent process steps to be described below can be performed in parallel so as to produce multiple semiconductor packages from a single sheet of metal.

Figure 1C:
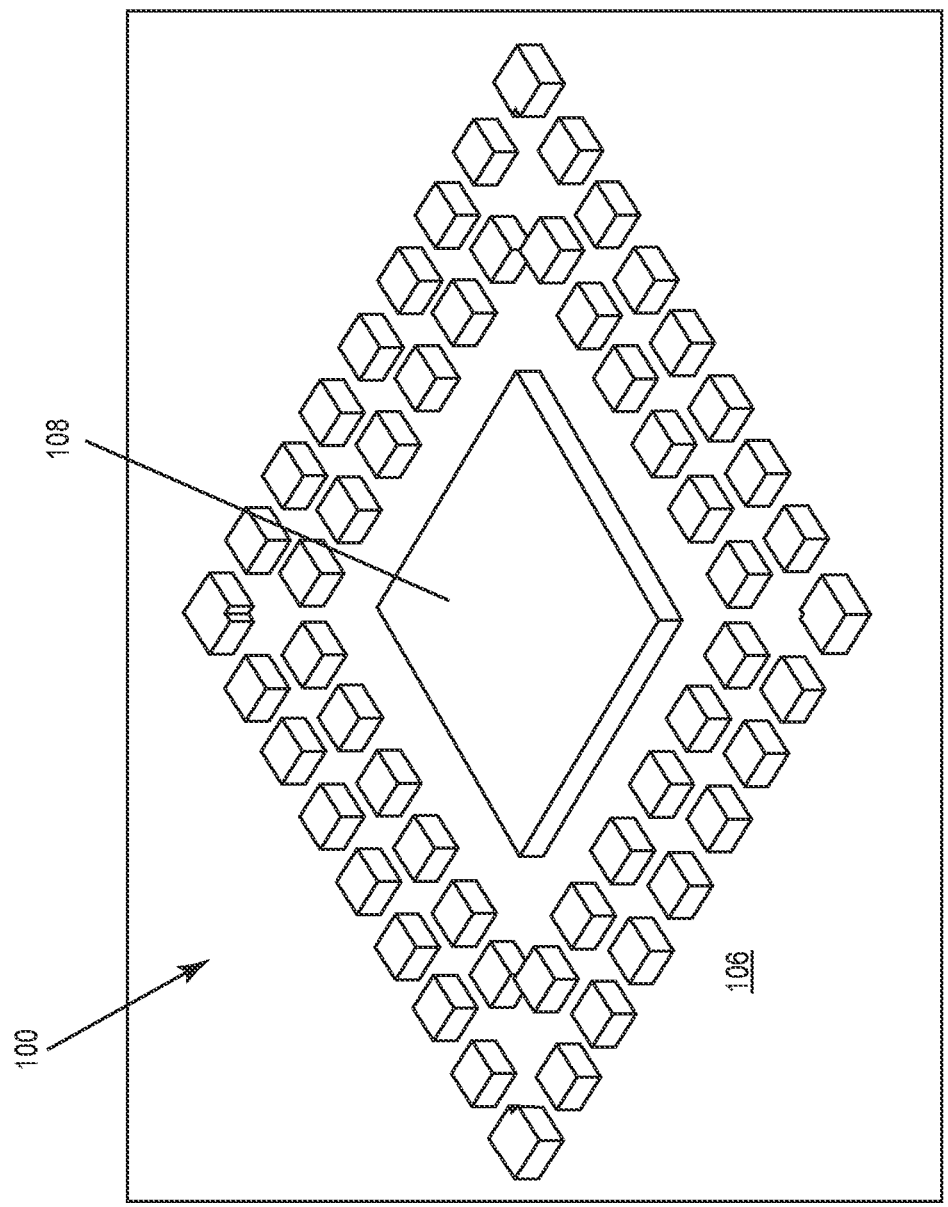

Referring to FIG. 1C, a semiconductor die 108 is mounted on the upper surface 106 of the base section 102. An adhesive such as solder, sinter, glue or tape may be provided between a rear surface of the semiconductor die 108 and the upper surface 106 of the base section 102 so as to maintain the position of the semiconductor die 108. The rear surface of the semiconductor die 108 may comprise a device terminals, such as a source or drain terminal in the case of a vertical device.

Figure 1E:
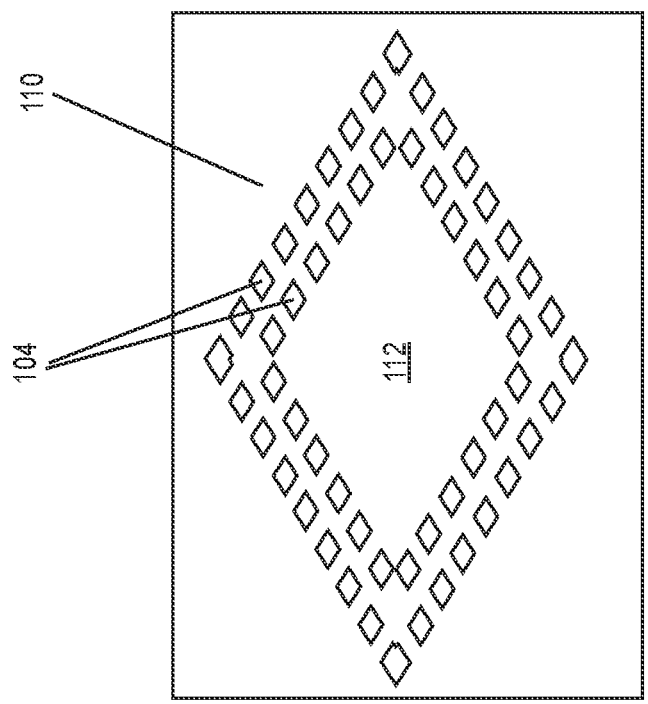
Figure 1D:
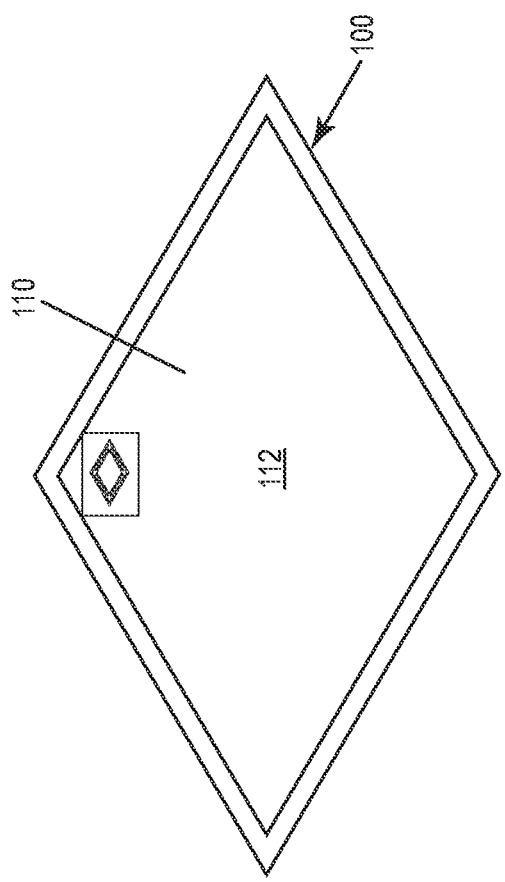

Referring to FIG. 1D, an encapsulant body 110 is formed on the upper surface 106 of the base section 102. The encapsulant body 110 can be formed by a molding process such as injection molding, transfer molding, compression molding, etc. As shown, the encapsulant body 110 can be formed on a single panel that comprises multiple package sites, so as to form the encapsulant body 110 for multiple ones of the semiconductor packages in parallel.

Generally speaking, the material of the encapsulant body 110 can include a wide variety of electrically insulating materials that are suitable for semiconductor packaging. Examples of these materials include mold compound, epoxy, thermosetting plastic, polymer, resin, fiber and glass woven fiber materials, etc. According to an embodiment, the encapsulant body 110 comprises a laser-activatable mold compound. A laser-activatable mold compound refers to a mold compound that includes metal particles, e.g., Cu, Ni, Ag, etc. These metal ions are released by a focused laser beam applied to the mold compound, which creates an active metal at the surface of the mold compound for a subsequent plating process, such as electroless plating or electroplating technique. In addition to the additive metal ions, a laser-activatable mold compound includes a polymer material as a base material. Examples of these polymers include thermoset polymers having a resin base, ABS (acrylonitrile butadiene styrene), PC/ABS (polycarbonate/acrylonitrile butadiene styrene), PC (polycarbonate), PA/PPA (polyimide/polyphthalamide), PBT (polybutylene terephthalate), COP (cyclic olefin polymer), PPE (polyphenyl ether), LCP (liquid-crystal polymer), PEI (polyethylenimine or polyaziridine), PEEK (polyether ether ketone), PPS (polyphenylene sulfide), etc.

As shown in FIG. 1E, ends of the metal posts 104 are exposed from a second surface 112 of the encapsulant body 110. This may be realized by initially over-molding the encapsulant body 110 over the metal posts 104 and subsequently removing encapsulant material, e.g., by chemical or mechanical methods, until the metal posts 104 are exposed. Alternatively, the mold tool used to form the encapsulant body 110 may be geometrically configured to obtain this arrangement.

Figure 1G:
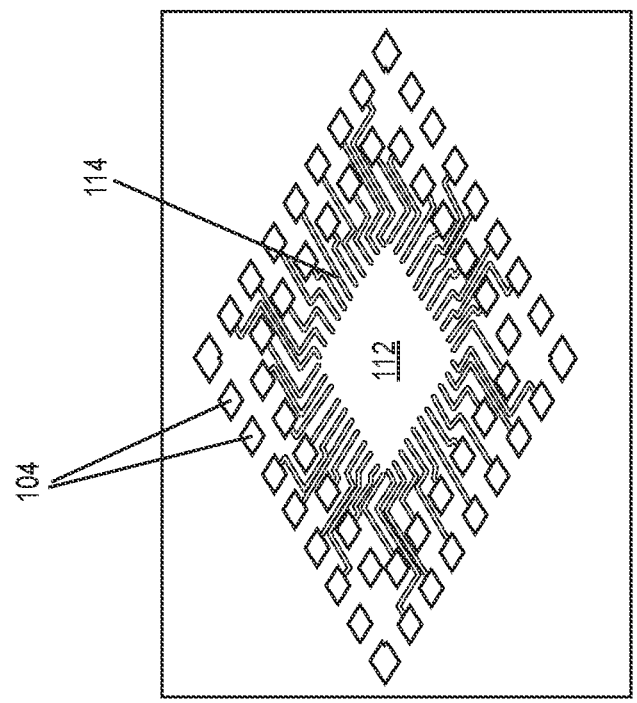
Figure 1F:
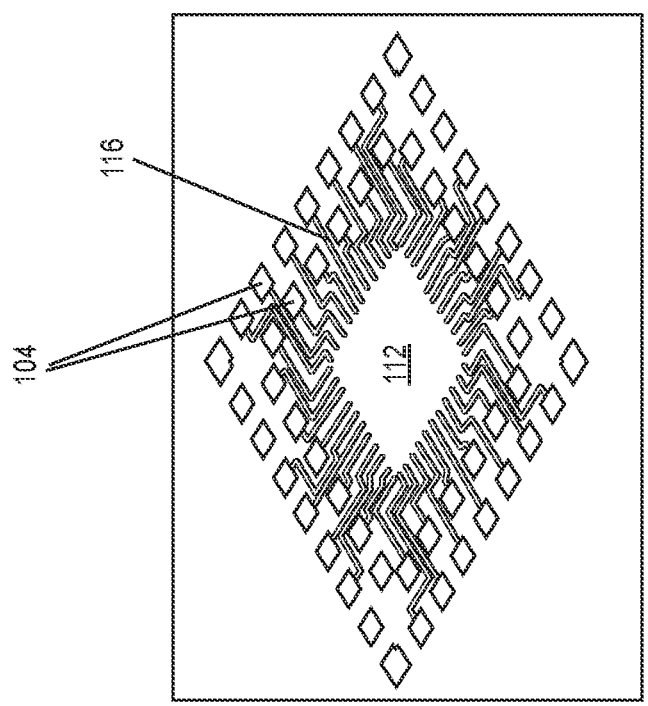

Referring to FIGS. 1F-G, a metal structuring process is performed after forming the encapsulant body 110 so as to form conductive tracks 114 in the second surface 112 of the encapsulant body 110. According to the depicted embodiment, a laser direct structuring technique is used to form the conductive tracks 114. According to this technique, as shown in FIG. 1F, a laser is applied to the second surface 112 of the encapsulant body 110 at selected regions of the laser-activatable mold compound that extend to the exposed ends of the metal posts. The laser energy applied to the encapsulant body 110, which comprises a laser-activatable mold compound, creates laser activated traces 116 in the second surface 112 of the encapsulant body 110. The laser activated traces 116 comprise metal complexes that act as a nuclei for a metal plating process, such as an electroless or electroplating process. As shown in FIG. 1F a plating process is performed to selectively form the conductive tracks 114 in the location of the laser activated traces 116 without forming metal in adjacent locations of the second surface 112 of the encapsulant body 110.

Generally speaking, the plating process used to form the conductive tracks 114 can be any type of plating technique including electroless plating techniques and electroplating techniques. According to an embodiment, the plating process comprises a sequence of electroless plating followed by electroplating. Initially, an electroless plating process that forms seed layer parts of the conductive tracks is performed. According to this technique, the device is submerged in a chemical bath that contains metal ions (e.g., Cu+ ions, Ni+ ions, Ag+ ions, etc.) that react with the organic metal complexes in the laser activated traces 116, thereby forming a the seed layer part of the metal track 114 from the element from the chemical bath. Generally speaking, the thickness of the seed layer parts may be no greater than 2 μm, no greater than 1.5 μm, or no greater than 1.0 μm, e.g., between about 500 nm and 1.0 μm. Subsequently, an electroplating process is performed with the seed layer parts present. According to this technique, the device is again submerged in a chemical bath that contains metal ions (e.g., Cu+ ions, Ni+ ions, Ag+ ions, etc.) and the metal ions are reduced (deposited) onto the seed layer parts through application of an electrical current. Advantageously, the base section 104 of the metal baseplate 100 remains intact during the electroplating process. This allows for the base section 104 to provide a common cathode terminal that is connected to the seed layer parts via each of the metal posts 104, thus making the formation of the conductive tracks 114 on the encapsulant body 110 by electroplating possible. The electroplating process forms thicker metal layer parts of the conductive tracks 114 on top of the seed layer parts. Accordingly, the thicker metal layer parts formed by the electroplating together with the seed layer parts together form the conductive tracks 114, with the thicker metal layer parts being thicker than the seed layer parts. Generally speaking, the thickness of the thicker metal layer parts may be at least 2 µm, at least 3 µm, or at least 5 µm, e.g., between about 5 µm and 10 µm. Conductive tracks 114 with these thickness values offer excellent electrical performance, including low electrical resistance and parasitic impact. By performing the sequence of electroless plating followed by electroplating, conductive tracks 114 with these advantageously high thickness values may be formed rapidly and inexpensively. In comparison to direct structuring techniques utilizing only electroless plating, the conductive tracks 114 can be formed much faster. In comparison to other interconnect techniques wherein a separate redistribution structure is formed, the plating process is less expensive, as no special tooling and fabrication lines are required to form the redistribution structure.

Instead of a laser a direct structuring technique, the conductive tracks 114 can be formed by other types of metal structuring process after forming the encapsulant body 100. For example, the conductive tracks 114 may be formed by a laser assisted metal deposition technique. According to this technique, a metal powder is applied to the second surface 112 of the encapsulant body 110 and a laser beam is used to fuse the metal power together into a metal track at the focal point of the laser beam. Separately or in combination, the conductive tracks 114 can be formed by an ink jet metal printing process. According to this technique, a viscous ink comprising a liquid solvent and a conductive metal, e.g., Ag, Cu, etc., is applied by a printer head in the desired location and subsequently dried. According to these techniques, the material of the encapsulant body 110 can be any type (not necessarily a laser-activatable mold compound) and the above described laser activation step can be omitted.

As shown in FIG. 1G, the conductive tracks 114 are formed to physically contact the exposed ends of the metal posts 104 and hence form an electrical connection with the metal posts 104. The conductive tracks 114 are routed over the location of the semiconductor die 108 and form electrical connections with upper surface terminals (not specifically shown in FIG. 1) of the semiconductor die 108 that face away from the metal baseplate. These electrical connections may be completed in a variety of different ways. According to one technique that is more particularly illustrated in FIGS. 6C-6D, conductive pillars 127 are formed on the terminals of the semiconductor die 108 that face away from the metal baseplate 100 before the encapsulation process. The conductive pillars 127 may comprise a metal such as copper, gold, aluminum, nickel, etc. and alloys thereof. Upper ends of these conductive pillars 127 are exposed at the second surface 112 of the encapsulant body 110, e.g., by mechanically or chemically removing the encapsulant material. The conductive tracks 114 may be formed to directly contact the outer ends of these conductive pillars 127, thus completing the electrical connection. A similar technique may be performed wherein metal stud bumps, e.g., Cu stud bumps are used instead of the conductive pillars 127. In yet another embodiment, openings are formed in the second surface 112 of the encapsulant body 110 so as to directly expose the upper surface terminals of the semiconductor die 108 that face away from the metal baseplate 100 from the encapsulant material. These openings may be formed as part of the lasering process that forms the laser activated traces 116. Subsequently, the plating process or processes which form the conductive tracks 114 may also form via structures in the openings, thus completing the electrical connection.

Referring to FIG. 1H, the base section 102 of the metal baseplate 100 is removed. This may be done by a variety of techniques. Examples of these techniques include any one or combination of: chemical etching, mechanical grinding, milling, or lasering. In each case, material from the base section 102 is removed from a rear side of the device until the metal posts 104 are no longer connected to one another by the metal baseplate 100. While the figure shows the process being performed on a single package, this process may be performed on a single metal plate before singulating multiple package sites to form individual semiconductor packages 101 (e.g., by cutting, lasering, etc.).

As shown in FIG. 1I, the removal of the base section 102 exposes a first surface 118 of the encapsulant body 110 that is opposite from the second surface 112 of the encapsulant body 110. Outer ends of the metal posts 104 are exposed at this second surface 112 of the encapsulant body 110. Moreover, in the depicted embodiment, a rear side of the semiconductor die 108 is exposed at the first surface 118 of the encapsulant body 110. The outer ends of the metal posts 104 and the rear side of the semiconductor die 108 may be coplanar with the second surface 112 of the encapsulant body 110 as a result of a planarization process.

As a result of the process steps described with reference to FIGS. 1A-1I, a semiconductor package 101 is formed that comprises a semiconductor die 108 encapsulated within an encapsulant body 110, wherein the encapsulant body 110 comprises metal posts 104 that are electrically connected to the terminals of the semiconductor die 108 and extend between first and second surfaces 118, 112 of the encapsulant body 110. Package contacts of the semiconductor package 101 may be formed be ends of the metal posts 104 that are exposed from the encapsulant body 110. In principle, the package contacts may provided by the exposed ends of the metal posts 104 at the second surface 112, or the exposed ends of the metal posts 104 at the first surface 118, or both. Thus, the semiconductor package 101 may be configured such that either one of the first and second surfaces 118, 112 of the encapsulant body 110 forms a mounting surface that is capable of mounting and electrical connection to a carrier structure, such as a PCB. Further processing techniques in addition to the steps taken with reference to FIG. 1A may be performed to form additional layers of conductive or insulating material on the semiconductor package 101. For example, an electrically insulating region of, e.g., polymer, resin, epoxy, glass, etc., may be provided on one or both sides of the semiconductor package 101 so as to protect and electrically insulate any exposed conductive surface wherein electrical connection is not desired. In one particular example of this concept, a solder resist layer such as a lacquer, epoxy, liquid photoimageable solder mask, dry-film photoimageable solder mask, etc. is formed to cover the conductive tracks 114 and/or the exposed ends of the metal posts 104 at the second surface 112 of the encapsulant body 110 so as to electrically isolate these structures. Separately or in combination, one or more application-specific coatings such as Ni, Au, Sn, Sn/Pb, Ag, Ag/Pd, etc., may also be applied to outer conductive surfaces including, e.g., the exposed ends of the metal posts 104 and/or the conductive tracks 114.

Figure 2B:
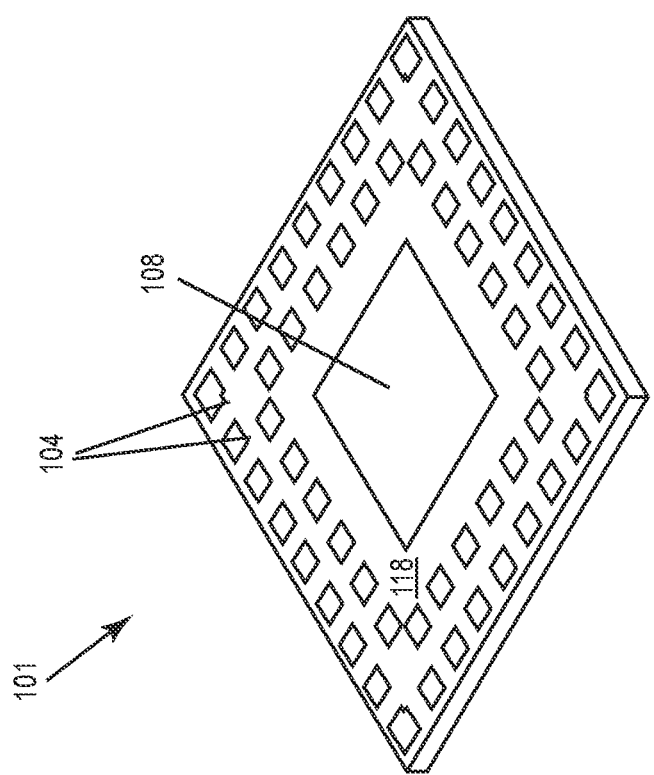
FIGS. 2A-2B, illustrates a semiconductor package, according to an embodiment.
Figure 2A:
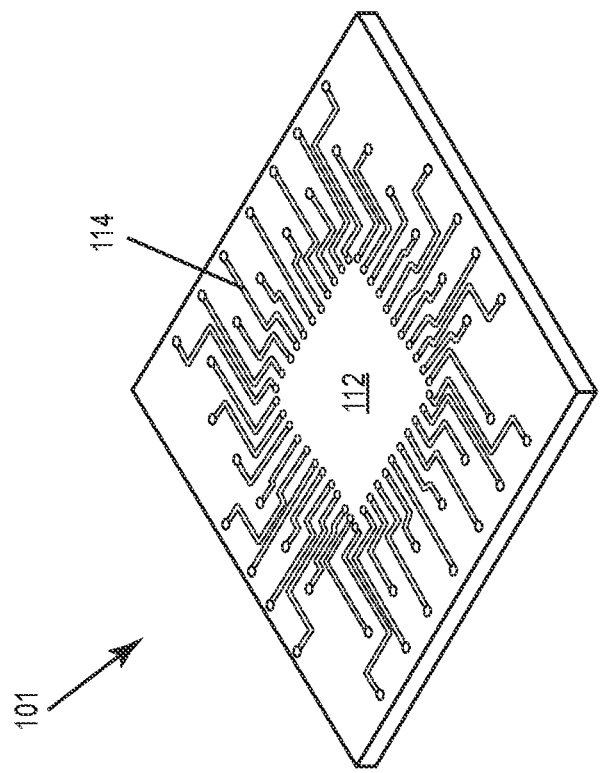

Referring to FIG. 2, one example of a semiconductor package 101 that may be formed according to the above described techniques is shown. The semiconductor package 101 is a so-called QFN (quad-flat-no-leads) package, wherein a side of the semiconductor package 101 comprising the exposed ends of the metal posts 108 at the first surface 118 of the encapsulant body 110 forms a mounting surface of the semiconductor package 101, and a side of the semiconductor package 101 comprising the conductive tracks 114 at the second surface 112 of the encapsulant body 110 forms a top side of the semiconductor package 104. Advantageously, the QFN package is realized with a very small package footprint, high integration density, and low cost.

Figure 3B:
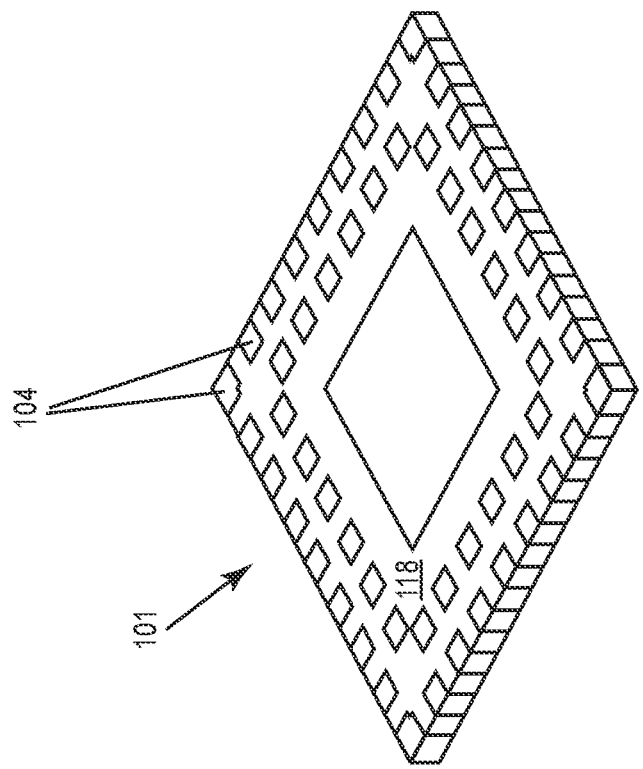
FIGS. 3A-3B, illustrates a semiconductor package, according to an embodiment.
Figure 3A:
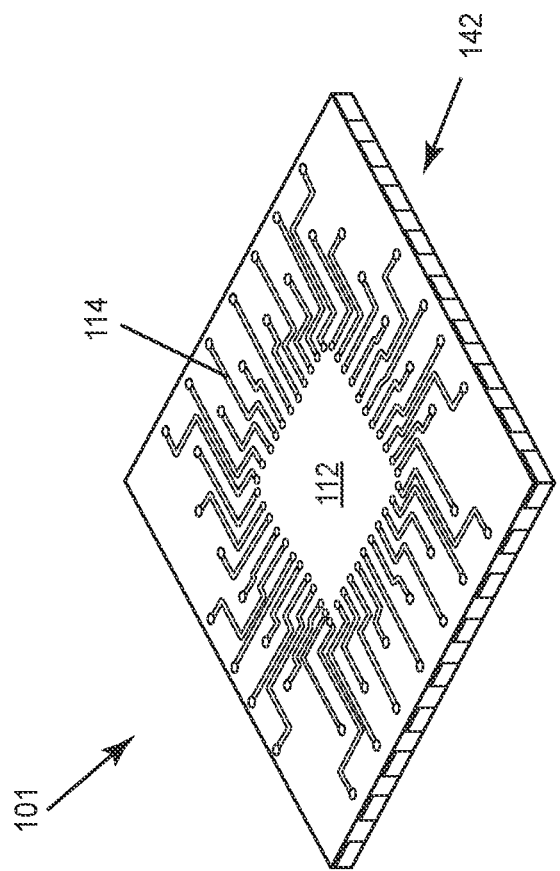

Referring to FIG. 3, another example of a semiconductor package 101 that may be formed according to the above described techniques is shown. The semiconductor package 101 is also a QFN package, and only differs from the semiconductor package 101 described with reference to FIG. 2 with respect to the configuration of the package contacts. In the semiconductor package 101 of FIG. 3, the encapsulant body 110 is formed such that the metal posts 104 form LTI (lead tip inspection) features 142. The LTI features 142 allow for optical inspection of a solder joint when the semiconductor package 101 is mounted and electrically connected to a carrier, such as a printed circuit board, and the package contacts of the semiconductor package 101 are soldered to the carrier. The LTI features 142 are formed by structuring the encapsulant body 110 to expose a sidewall of one of the metal posts 104 at an outer edge side of the encapsulant body 110. For example, the encapsulant material can be removed by etching, lasering, etc. after forming the encapsulant body 110 to expose the metal post. Alternatively, the mold cavity which forms the encapsulant body 110 can be configured so as to not cover the outer sidewalls of the metal posts 104 with encapsulant material during the encapsulation process. A specific discussion of potential geometric configurations for the LTI feature 142 is provided below with reference to FIG. 12.

Figure 4B:
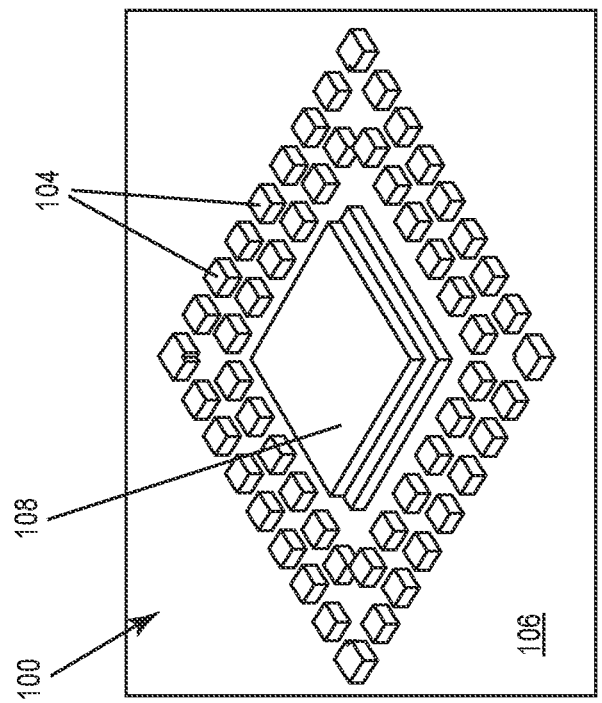
FIGS. 4A-4B, illustrates selected steps in a method of forming a semiconductor package, according to an embodiment.
Figure 4A:
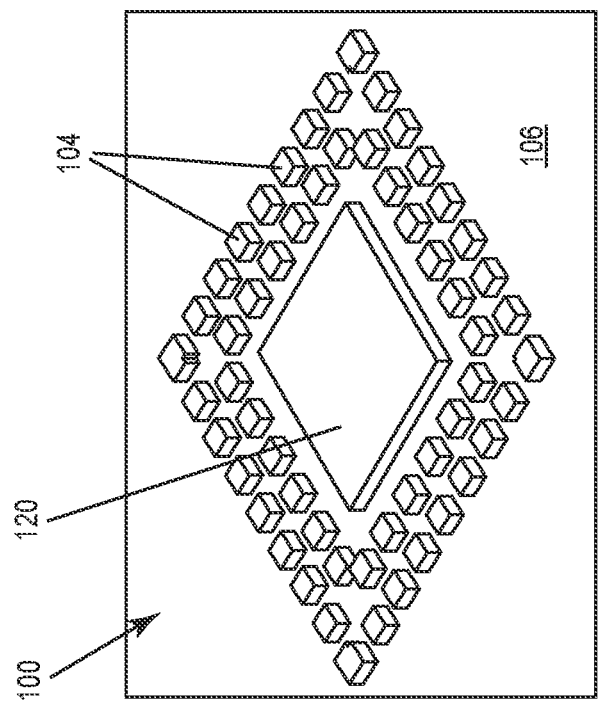

Referring to FIG. 4, a method for forming the semiconductor package 101 is shown, according to another embodiment. In this case, the semiconductor package 101 is formed to comprise a metal die pad 120 that is thermally coupled to the semiconductor die 108. As shown in FIG. 4A, the metal baseplate 100 is provided to further comprise the die pad 120 located in a central region between the metal posts 104. The die pad 120 is a locally thicker part of the metal baseplate 100 that is elevated from the surrounding upper surface 106 of the base section 102. However, the die attach surface of the die pad 120 is below the outer ends of the metal posts 104 that are elevated from the upper surface 106 of the base section 102 so as to accommodate the thickness of the semiconductor die 108 in the completed semiconductor package 101. As shown in FIG. 4B, the semiconductor die 108 is mounted on the die pad 120 in a similar manner as previously described. Subsequently, the above described processing steps may be performed to complete the formation of the semiconductor package 101. When the baseplate 100 is removed, e.g., according to the process described with reference to FIG. 1H, the die pad 120 remains intact as part of the semiconductor package.

Figure 5B:
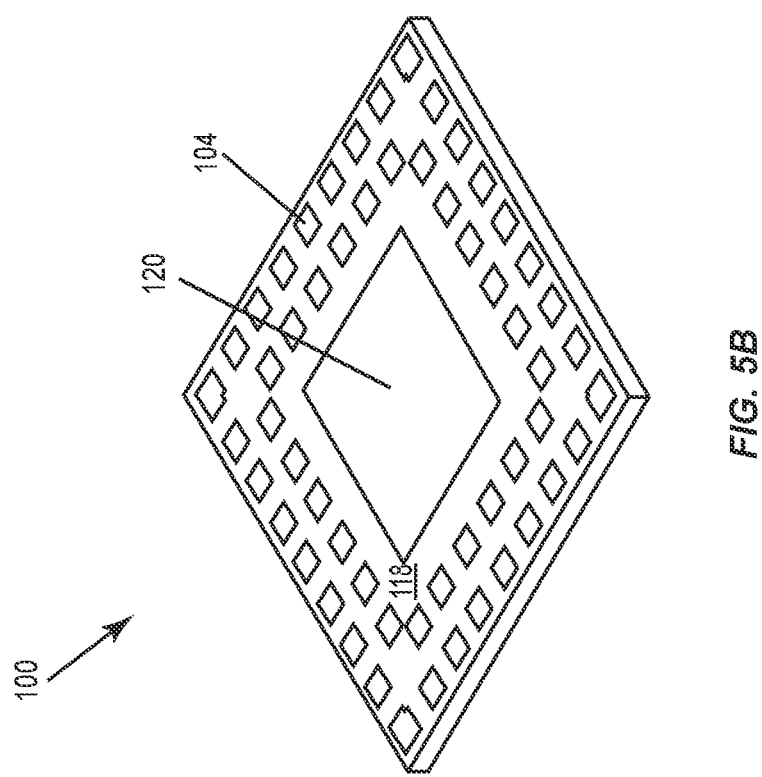
FIGS. 5A-5B, illustrates a semiconductor package, according to an embodiment.
Figure 5A:
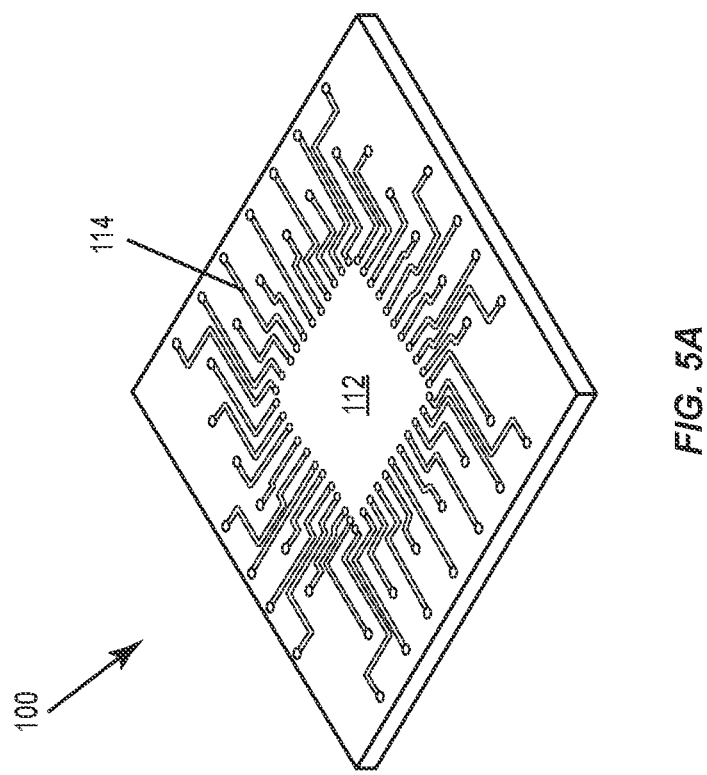

Referring to FIG. 5, one example of a semiconductor package 101 that is configured as a QFN package is shown. The semiconductor package 101 is identical to the semiconductor package 101 described with reference to FIG. 3, except it includes the metal die pad 120 that is thermally coupled to the semiconductor die 108. As shown in FIG. 5B, an outer surface of the die pad 120 is exposed at the first surface 118 of the encapsulant body 110. Thus, the mounting surface of the semiconductor package 101 may comprise the die pad 120, which may be preferred in certain applications for heat dissipation purposes.

Referring to FIG. 6, a method for forming a semiconductor package 101 that comprises two of the semiconductor dies 108 is depicted, according to an embodiment. As shown in FIG. 6A, the base section 102 of the metal baseplate 100 may be provided to comprise first and second die attach regions 122, 124 that are each dimensioned to accommodate the mounting of a semiconductor die 108 thereon. The configuration of the metal posts 104 (e.g., size, location) surrounding each of the first and second die attach regions 122, 124 may differ from one another so as to accommodate different I/O connectivity for a particular semiconductor die 108.

Figure 6B:
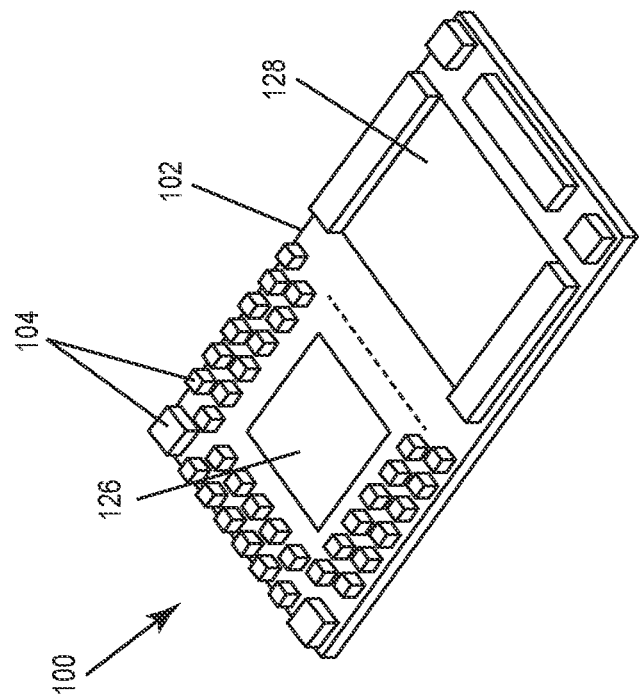
Figure 6A:
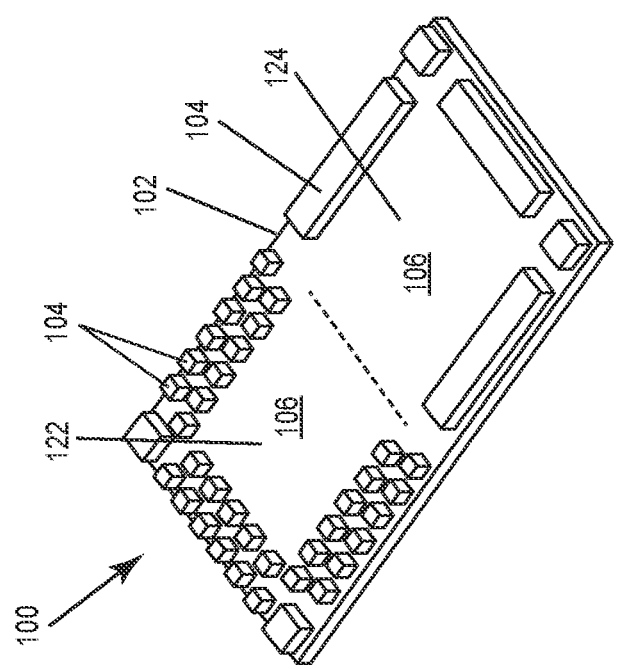

As shown in FIG. 6B, a first pad 126 is provided on the upper surface 106 of the metal baseplate 100 in the first die attach region 122 and a second pad 128 is provided on the upper surface 106 of the metal baseplate 100 in the second die attach region 124. Generally speaking, the first pad 126 and the second pad 128 can be electrically insulating or electrically conductive. For example, either one of the first and second pads 126, 128 may be an electrically insulating structure formed from, e.g. polymer, resin, epoxy, glass, etc. Alternatively, one or both of the first and second pads 126, 128 may be an electrically conductive structure formed from, e.g. copper, aluminum, nickel, etc., and alloys thereof. The first and second pads 126, 128 may be attached to the metal baseplate 100 by an adhesive, e.g., solder, glue, etc. In the case of a metal structure, the first and second pads 126, 128 may be formed by a metal deposition technique, e.g., plating, sputtering, etc. According to an embodiment, the first pad 126 is an electrically insulating structure and the second pad 128 is an electrically conductive structure. As shown, the second pad 128 may be formed to extend to the metal posts 104 adjacent to the second die attach region 128, thus forming a conductive connection thereto.

As shown in FIG. 6C, a first one of the semiconductor dies 108 is mounted on the first pad 126 and a second one of the semiconductor dies 108 is mounted on the second pad 128. Generally speaking, the semiconductor dies 108 may have any configuration. According to an embodiment, the first semiconductor die 108 that is mounted on the first pad 126 is a logic device and the second semiconductor die 108 that is mounted on the second pad 128 is a power device. More particularly, the second semiconductor die 108 that is mounted on the second pad 128 may be a power transistor, e.g., MOSFET IGBT, etc., that is rated to block voltages on the order of 100 V (volts), 600 V, 1200 V or more, and the first semiconductor die 108 that is mounted on the first pad 126 is a driver die that is configured to control a switching operation of the power transistor. Each of the semiconductor dies 108 comprise terminals that face away from the metal baseplate 100. In the case of the first semiconductor die 108 that is mounted on the first pad 126, these terminals may correspond to the I/O terminals, e.g., for a logic device. In the case of the second semiconductor die 108 that is mounted on the second pad 128, the terminals that face away from the metal baseplate 100 may correspond to a gate terminal and a load terminal, e.g., source, drain, collector, emitter, etc., e.g., for a power transistor. Meanwhile, a second load terminal of the second semiconductor die 108, e.g., the opposite one of the source, drain, collector, emitter, etc., may face and electrically connect with the second pad 128. Conductive pillars 127 are formed on the terminals of the semiconductor dies 108 that face away from the metal baseplate 100, e.g., in a similar manner as previously described. In other embodiments, both of the semiconductor dies 108 are power transistors, or both of the semiconductor dies 108 are logic devices, and the connection techniques described herein are used to form a package interconnection between the two.

As shown in FIG. 6D, the encapsulant body 110 is formed such that upper ends of the conductive pillars 127 and the metal posts 104 are exposed at a first side 112 of the encapsulant body 110, e.g., in a similar manner as previously described. In the case of the metal posts 104 that are covered by the second pad 128, the part of the second pad 128 covering the metal post 104 is exposed at the first side 112 of the encapsulant body 110.

Referring to FIG. 6E, a metal structuring process is performed after forming the encapsulant body 110 to form electrical interconnects. This metal structuring process comprises forming the conductive tracks 114 between the terminals of the first one of the semiconductor dies 108 and the metal posts 104, thereby forming I/O connections for the first one of the semiconductor dies 108, e.g., in the case of a logic device. One of the conductive tracks 114 forms a direct electrical connection between a terminal from the first one of the semiconductor dies 108 that is mounted on the first pad 126 and the second one of the semiconductor dies 108 that is mounted on the second pad 128. This connection may correspond to a gate control connection between an output terminal of the first one of the semiconductor dies 108 and a gate terminal of the second one of the semiconductor dies 108, for example. The conductive tracks 114 can be formed according to any of the previously described techniques, e.g., laser direct structuring, laser assisted metal deposition, ink jet metal printing. Additionally, a metal connection plate 130 may be formed over the second one of the semiconductor dies 108 that is mounted on the second pad 128. The metal connection plate 130 may contact a load terminal of the semiconductor dies 108, e.g., in the case of a power transistor die. The metal connection plate 130 can be a separate metal plate, e.g. a Cu plate, that is attached to the semiconductor die 108, e.g., by soldering before or after the encapsulation process. Alternatively, the metal connection plate 130 may be formed by the same techniques used to form the conductive tracks 114 as described above including laser direct structuring, inkjet metal printing or laser assisted metal deposition, for example. As shown, the metal connection plate 130 may be formed to contact at least one of the metal posts 104, thus forming an electrical connection thereto.

Figure 6G:
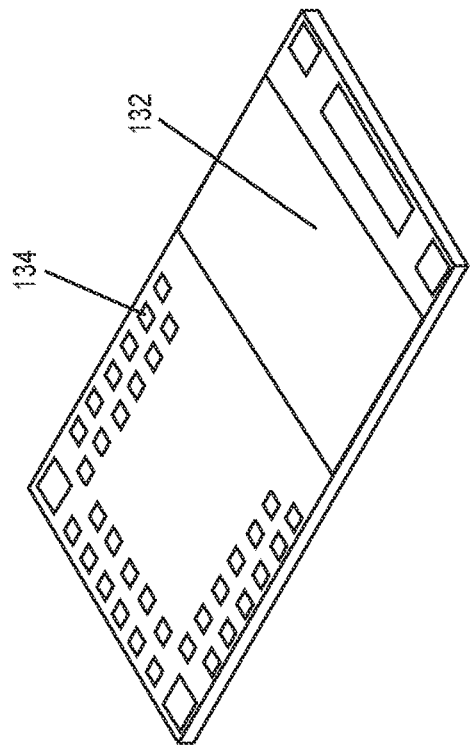
Figure 6F:
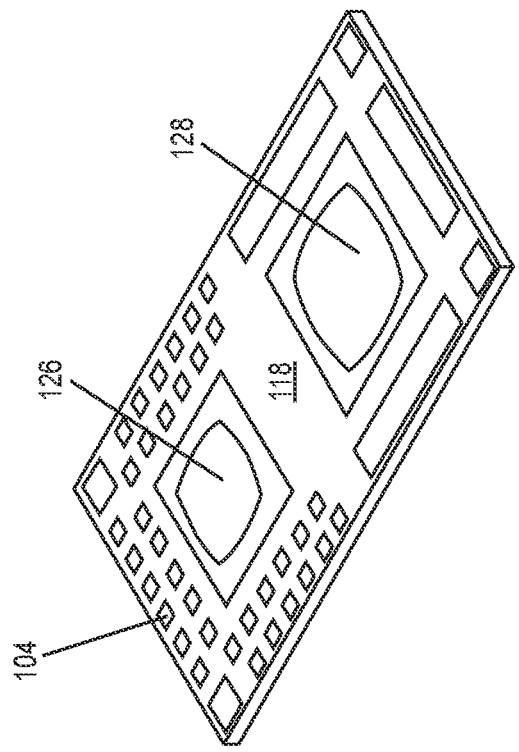

Referring to FIG. 6F, the base section 102 of the metal baseplate 100 is removed, e.g., according to any of the previously described techniques. As a result, rear sides of the first pad 126 and the second pad 128, along with ends of the metal posts 104, are exposed at the first surface 118 of the encapsulant body 110.

Referring to FIG. 6G, further processing steps may be performed after removal of the base section 102. These further processing steps may comprise providing a cooling plate 132 over the exposed part of the second pad 128. The cooling plate 132 may comprise a thermally conductive material. For example, the cooling plate 132 can be a metal structure, e.g., Cu, Al, Ni, and alloys thereof, that is attached to the exposed part of the second pad 128 by a conductive adhesive, e.g., solder, glue, etc. In that case, the cooling plate 132 may be configured as a point of electrical contact to a rear surface terminal of the second semiconductor die 108. Alternatively, if electrical isolation is preferred, the cooling plate 132 can comprise a thermally conductive and electrically insulating material, such as a TIM (thermal interface material). Outside of the cooling plate 132, a solder resist material 134 may be formed over the exposed surfaces of the metal posts 104, thereby protecting and electrically isolating these structures at this side of the device.

Figure 7B:
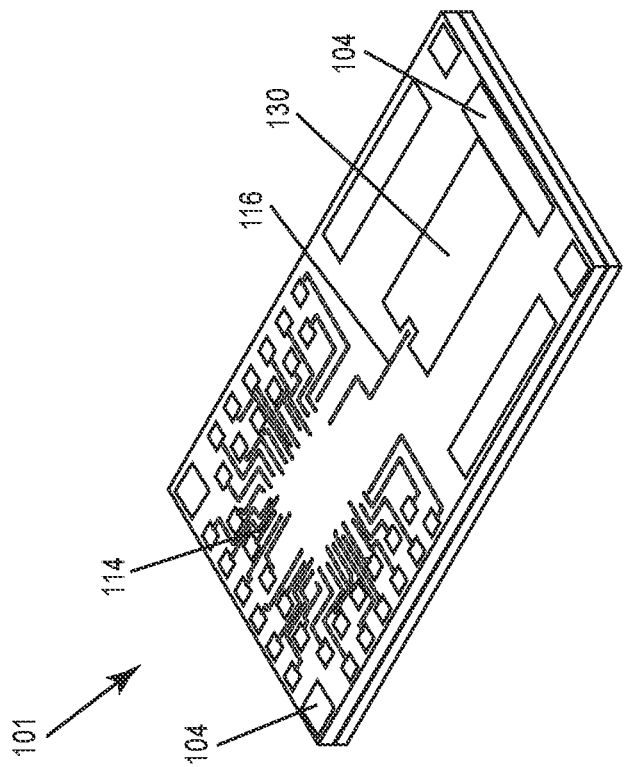
FIGS. 7A-7B, illustrates a semiconductor package, according to an embodiment.
Figure 7A:
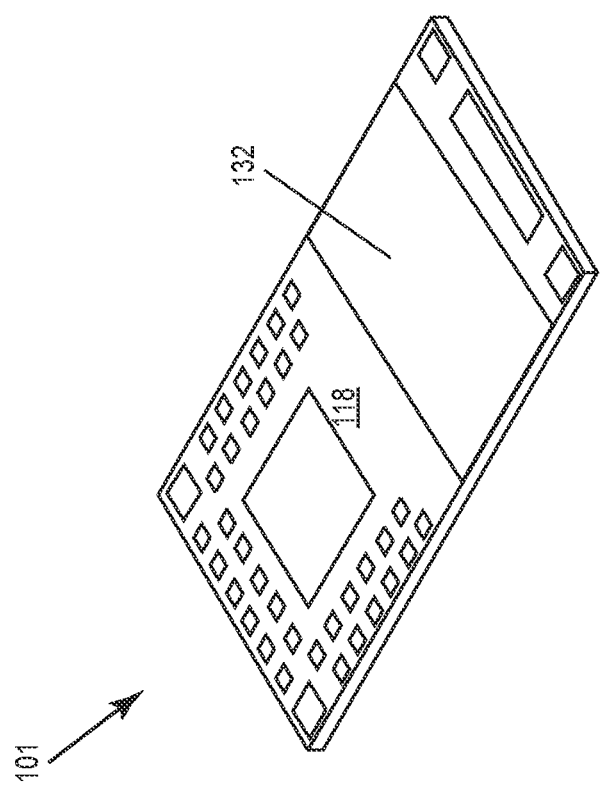

Referring to FIG. 7, a completed semiconductor package 101 that is formed according to the method described with reference to FIG. 6 is shown. The side of the semiconductor package shown in FIG. 7A may correspond to a top side of the semiconductor package 101 that faces away from a carrier such as a PCB in a mounted arrangement. The cooling plate 132 can radiate operational heat into the ambient environment during operation. Optionally, a heat sink structure may be mounted on the cooling plate 132. Meanwhile, the side of the semiconductor package shown in FIG. 7B may correspond to a mounting surface of the semiconductor package 101, wherein outer ends of the metal posts 104 form the package contacts that interface with and electrically connect to the carrier. Thus, in a difference to the previously described embodiments, the side of the semiconductor package 101 comprising the conductive tracks 114 at the second surface 112 of the encapsulant body 110 forms a mounting surface of the semiconductor package 101. A solder resist material 114 may be applied over the conductive tracks 114 and/or over the metal connection plate 130 so as to electrically isolate these structures from the carrier structure, while leaving the outer ends of the metal posts 104 available for electrical contact.

Figure 8B:
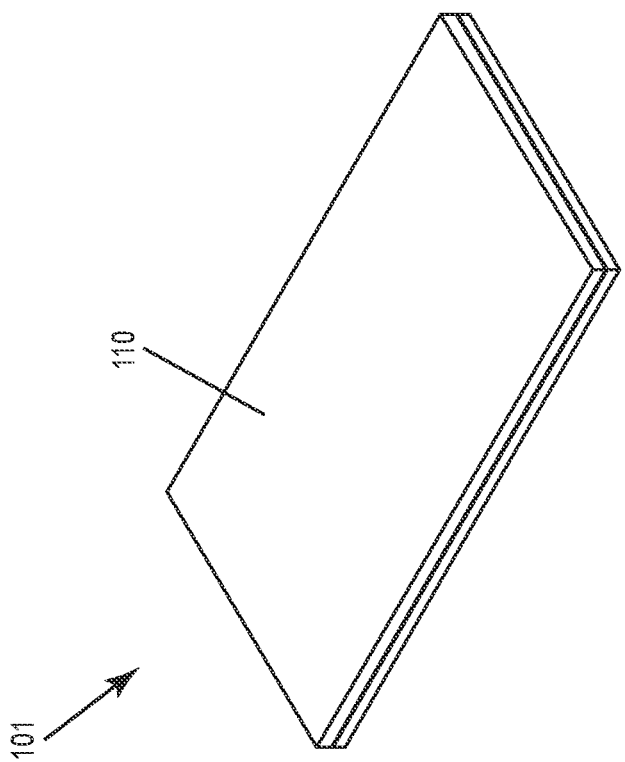
FIGS. 8A-8B, illustrates selected steps in a method of forming a semiconductor package, according to an embodiment.
Figure 8A:
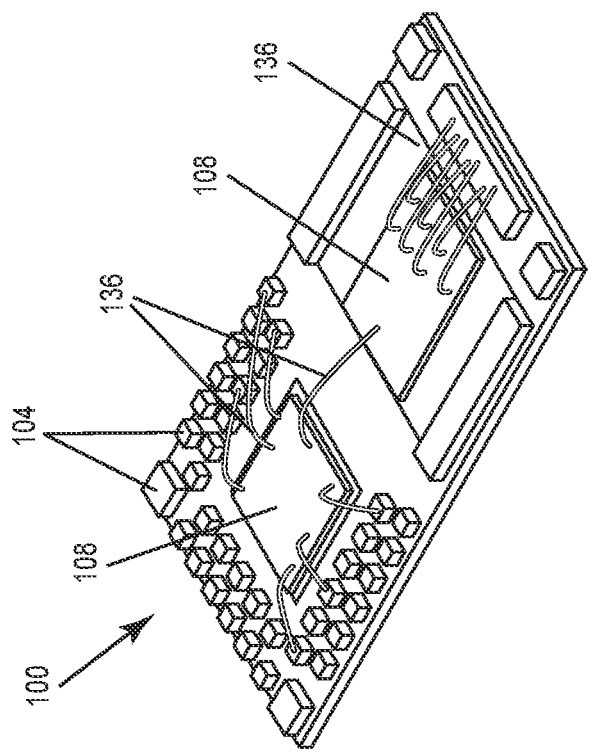

Referring to FIG. 8, a method for forming the semiconductor package 101 is shown, according to another embodiment. In this case, wire bonding is used instead of metal structuring on the encapsulant body 110. As shown in FIG. 8A, bond wires 136 are provided. These bond wires 136 connect the terminals semiconductor dies 108 to the metal posts 104 and connect the terminals of the semiconductor dies 108 to one another in a similar manner as previously described. As shown in FIG. 8B, after forming the bond wires 136, the encapsulation process is performed to form the encapsulant body 110. In this case, the encapsulant body 110 is formed to completely cover the bond wires 136 and the ends of the metal posts 104. The base section 102 of the baseplate may be removed to expose the ends of the metal posts 104 in a similar manner as previously described, thereby providing package contacts at the first surface 118 of the encapsulant body 102.

Figure 9B:
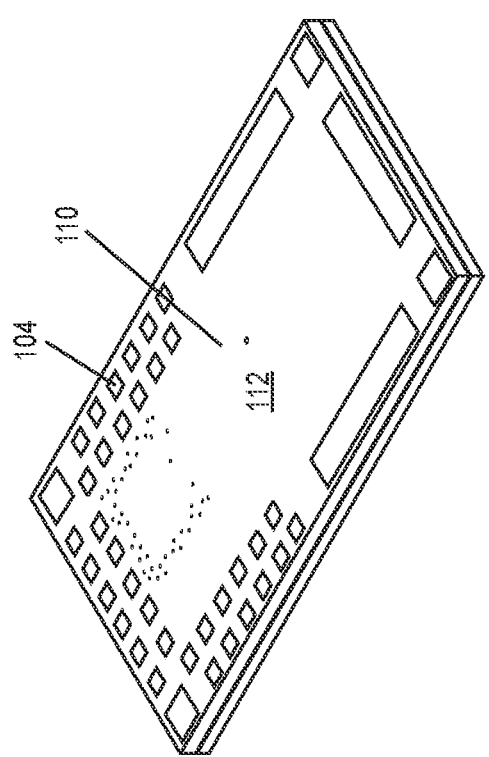
FIGS. 9A-9C, illustrates selected steps in a method of forming a semiconductor package, according to an embodiment.
Figure 9C:
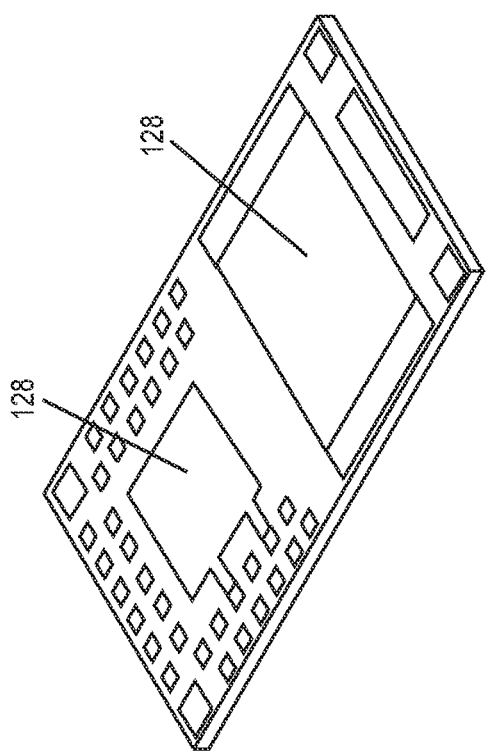
Figure 9A:
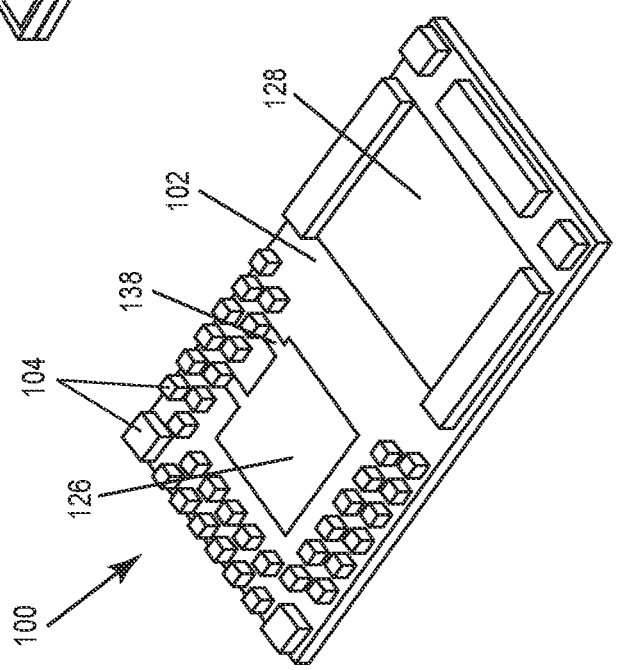
Figure 10A:
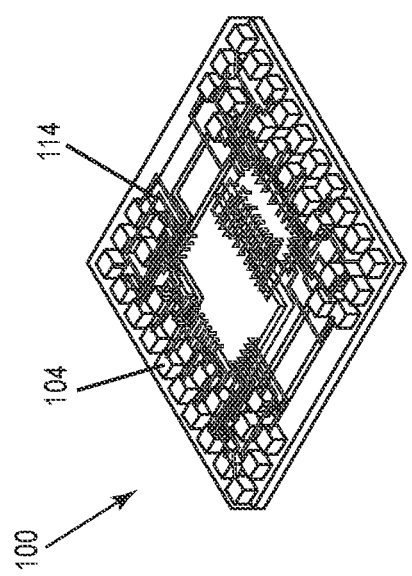
FIGS. 10A-10D, illustrates selected steps in a method of forming a semiconductor package, according to an embodiment.
Figure 10C:
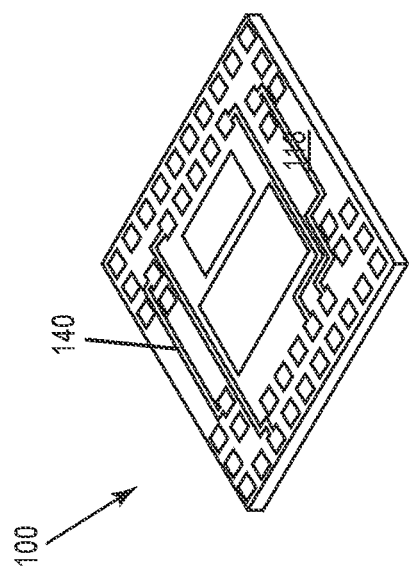
Figure 10B:
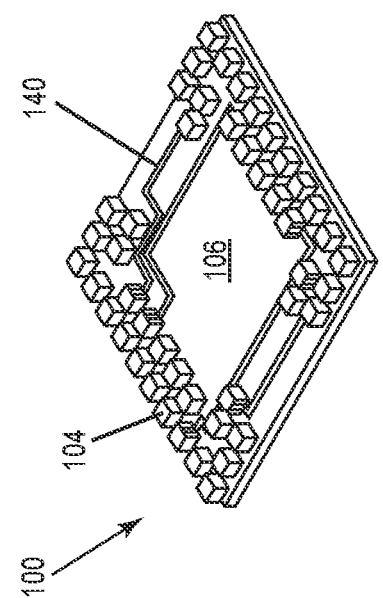
Figure 10D:
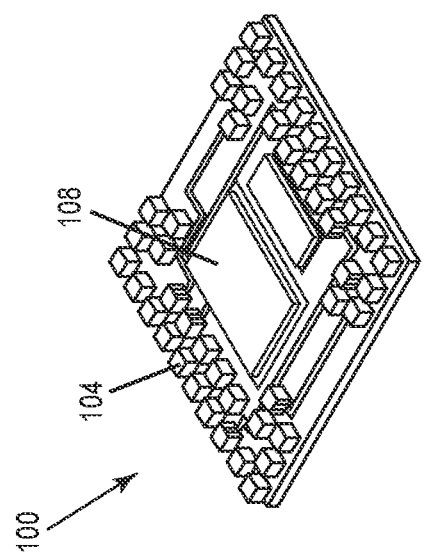

Referring to FIG. 9, a method for forming the semiconductor package 101 is shown, according to another embodiment. In this case, a first pad 126 is used to form electrical interconnections to the metal posts. To this end, the first pad 126 electrically can be an electrically conductive structure. For example, the first pad 126 may be a metal structure comprising, e.g., Pd, Ag, Au, Ni, etc., and alloys thereof. As shown in FIG. 9A, the first pad 126 may be formed to comprise connectors 138 extending between a main pad portion of the first pad 126 and the metal posts 104. The semiconductor die 108 is mounted on the main pad portion of the first pad 126, and comprises a terminal that faces and electrically connects with the first pad 126. Thus, the lower surface terminal of the semiconductor die 108 is electrically connected to the metal posts 104 via connectors 138. As shown in FIG. 9B, after mounting of the semiconductor dies 108, the encapsulant body 110 can be formed in a similar manner as previously described. Conductive tracks 114 may be formed in a similar manner as previously described. As a result of the configuration of the first pad 126, the downward facing terminal of the semiconductor die 108 is electrically accessible via the exposed ends of the metal posts 104 at the second surface 112 of the encapsulant body 110. Meanwhile, as shown in FIG. 9C, the first and second pads 126, 128 may be used at the opposite side of the semiconductor package 101 as electrical terminals and/or cooling surfaces. The material composition of the first and second pads 126, 128 can be selectively etchable relative to the material composition of the base section 102. This allows for the base section 102 to be etched selectively relative to first and second pads 126, 128, thereby leaving the first and second pads 126, 128 intact after removal of the base section 102. For example, the first and second pads 126, 128 can comprise Pd, Ag, or Au in the case of a base section 102 that comprises Cu.

Referring to FIG. 10, a method for forming the semiconductor package 101 is shown, according to another embodiment. In this case, as shown in FIG. 10A, the metal baseplate 100 is provided to comprise at least one metal trace 140 on the upper surface 106 of the base section 100. The metal traces 140 are elevated from the planar upper surface 106 of the base section 102 and contact the metal posts 104. The metal traces 140 may comprise the same or different metal as the metal of the base section 102. For example, the metal traces 140 may be formed by performing an etch of the planar sheet of metal which forms the metal baseplate 100. Alternatively, the metal traces 140 may be formed by an additive technique, e.g., plating, sputtering, etc., wherein, e.g. copper, silver aluminum, nickel, etc. is deposited on the planar upper surface 106 of the base section 102. As shown in FIG. 10B, semiconductor dies 108 are mounted on a die attach region of the metal baseplate 100. As shown in FIG. 10C, terminals of the semiconductor dies 108 which face away from the metal baseplate 100 are electrically connected the metal posts 104 by forming conductive tracks 114 in the encapsulant body 110, e.g., in a similar manner as previously described. As shown in FIG. 10D, after removing the base section 102 from the metal baseplate 100, the metal traces 140 remain intact due to the fact that they are elevated from the planar upper surface 106 of the base section 102. Thus, the metal traces 140 form a second level of conductive tracks in the first surface 118 of the encapsulant body in addition to the conductive tracks 114 that are formed in the second surface 112 of the encapsulant body 110.

Figure 11B:
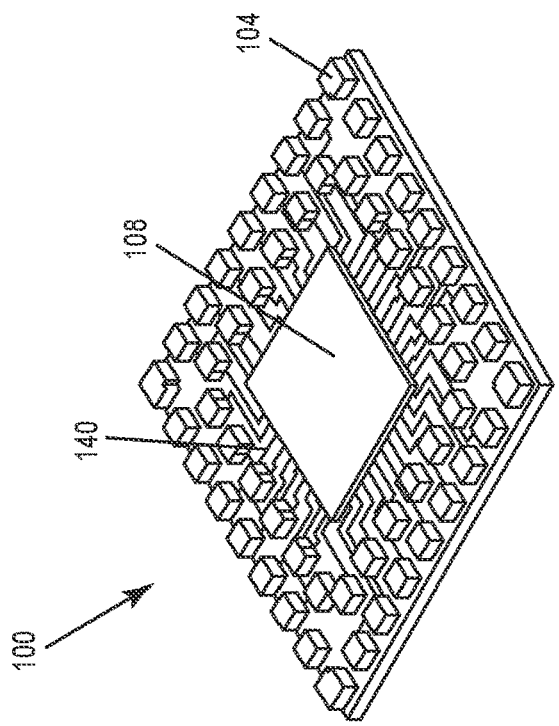
FIGS. 11A-11C, illustrates selected steps in a method of forming a semiconductor package, according to an embodiment.
Figure 11C:
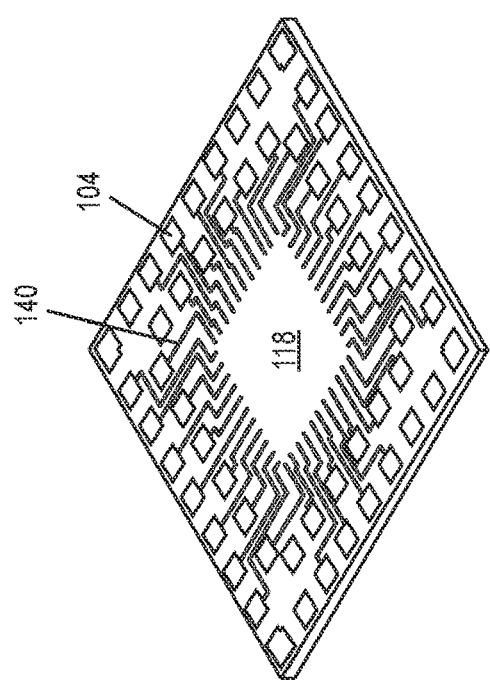
Figure 11A:
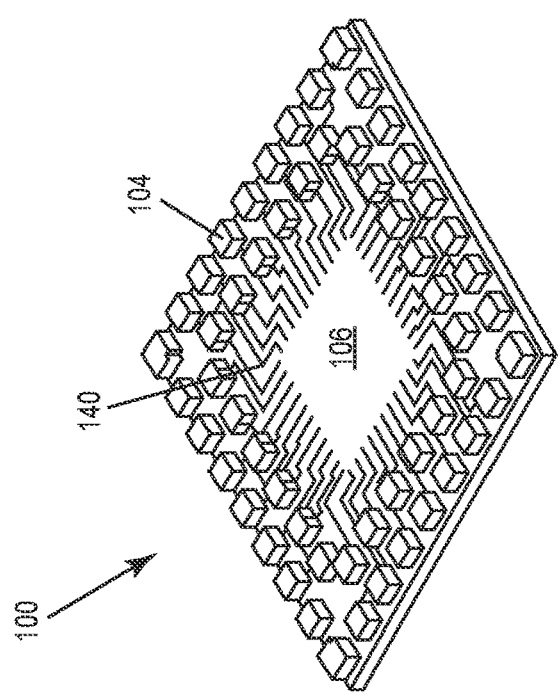

Referring to FIG. 11, a method for forming the semiconductor package 101 is shown, according to another embodiment. In this case, as shown in FIG. 11A, the metal baseplate 100 is provided to comprise the metal traces 140 on the upper surface 106 of the base section 100 and a die attach area on the upper surface of the metal baseplate 100 that is devoid of the metal traces 140. Further, the metal traces 140 are formed to extend between the between the die attach area and the metal posts 104. As shown in FIG. 11B, the semiconductor die 108 is mounted on the die attach area such that the terminals of the semiconductor die 108 face and electrically connect with metal traces 140 that extend directly underneath the semiconductor die 108. For example, the semiconductor die 108 may have a flip-chip configuration, wherein each of the metal traces 140 are connected to the respective terminals of the semiconductor die 108 by solder joints, for example. As shown in FIGS. 11C, after the base section 102 is removed, the metal traces 140 that remain intact form the necessary electrical interconnect between the terminals of the semiconductor die 108 and the metal posts 104. Thus, according to this concept, an interconnect level is provided at the first surface 118 of the encapsulant body 110 and the conductive tracks 114 at the second surface 112 of the encapsulant body 110 may be omitted. Alternatively, a further interconnect layer may be provided at the second surface 112 of the encapsulant body 110 according to the previously described techniques.

Figure 12A:
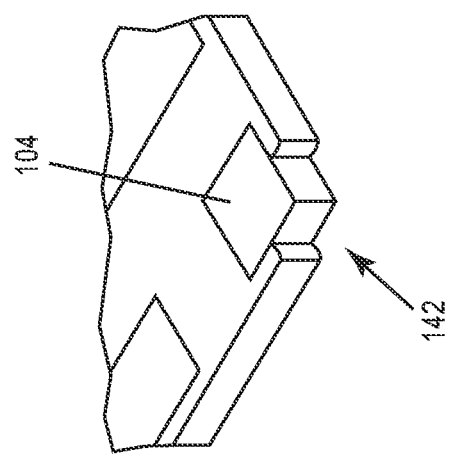
FIGS. 12A-12B, illustrates a lead tip inspection feature of a semiconductor package, according to an embodiment.
Figure 12B:
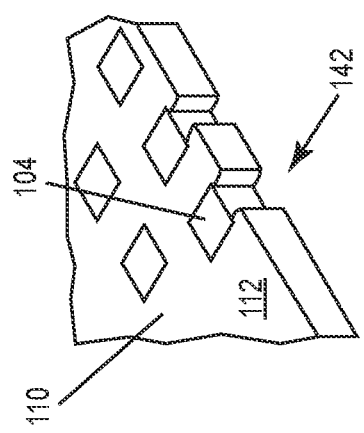

Referring to FIG. 12, any of the semiconductor packages 101 described herein may be formed to comprise an LTI (lead tip inspection) feature 142. As shown in each of FIGS. 12A and 12B, the exposed sidewall of the metal posts 104 can extend completely between the first surface 118 of the encapsulant body 110 and the second surface 112 of the encapsulant body 110 that is opposite from the first surface 118. Separately or in combination, a complete width of the metal post 108 may be exposed at the outer edge side of the encapsulant body 110. In this way, a large area is available for inspection of soldered joints. As is particularly shown in FIG. 12B, the encapsulant body 110 may be structured so that a second exposed sidewall from the one of the metal posts 104 is exposed, wherein the second exposed sidewall extends completely between the first surface 118 of the encapsulant body 110 and the second surface 112 of the encapsulant body 110 and forms an angled intersection with the first sidewall. In this way, lead tip inspection may be further enhanced, as a recognizable corner is exposed from the encapsulant body 110.

The semiconductor package 101 described herein may comprise one or more semiconductor dies 108 with a variety of different configurations. These semiconductor dies 108 may be singulated from a semiconductor wafer (not shown), e.g. by sawing, prior to being mounting on the metal baseplate 100. In general, the semiconductor wafer and therefore the resulting semiconductor die 108 may be made of any semiconductor material suitable for manufacturing a semiconductor device. Examples of such materials include, but are not limited to, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), etc. In general, the semiconductor die 108 can be any active or passive electronic component. Examples of these devices include power semiconductor devices, such as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g., PIN diodes or Schottky diodes, etc. Other examples of these devices include logic devices, such as microcontrollers, e.g., memory circuits, level shifters, etc. One or more of the semiconductor dies 108 can be configured as a so-called lateral device. In this configuration, the terminals of the semiconductor die 108 are provided on a single main surface and the semiconductor die 108 is configured to conduct in a direction that is parallel to the main surface of the semiconductor die 108. Alternatively, one or more of the semiconductor dies 108 can be configured as a so-called vertical device. In this configuration, the terminals of the semiconductor die 108 are provided on opposite facing main and rear surfaces and the semiconductor die 108 is configured to conduct in a direction that is perpendicular to the main surface of the semiconductor die 108.

The term "electrically connected" as used herein describes a permanent low-ohmic, i.e., low-resistance, connection between electrically connected elements, for example a wire connection between the concerned elements. By contrast, the term "electrically coupled" contemplates a connection in which there is not necessarily a low-resistance connection and/or not necessarily a permanent connection between the coupled elements. For instance, active elements, such as transistors, as well as passive elements, such as inductors, capacitors, diodes, resistors, etc., may electrically couple two elements together.

Spatially relative terms such as "under," "below," "lower," "over," "upper," "main", "rear", and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a semiconductor package, the method comprising:
   providing a metal baseplate comprising a base section and a plurality of metal posts, the base section being a planar pad of substantially uniform thickness, the plurality of metal posts each extending up from a planar upper surface of the base section;
   mounting a semiconductor die on the upper surface of the metal baseplate;
   forming an encapsulant body of electrically insulating mold compound on the upper surface of the base section;
   electrically connecting terminals of the semiconductor die to the metal posts; and
   removing the base section so as to form package contacts from the metal posts at a first surface of the encapsulant body,
   wherein the semiconductor die is mounted with at least some of the terminals facing away from the metal baseplate, and wherein electrically connecting terminals of the semiconductor die to the metal posts comprises:
   providing conductive pillars on the terminals of the semiconductor die that face away from the metal baseplate before forming the encapsulant body;
   exposing upper ends of the conductive pillars at a second surface of the encapsulant body after forming the encapsulant body; and
   forming conductive tracks in the second surface of the encapsulant body.

2. The method of claim 1, wherein the package contacts comprise ends of the metal posts that are exposed at one or both of the first surface of the encapsulant body and a second surface of the encapsulant body, the second surface being opposite from the first surface.

3. The method of claim 1, wherein removing the base section comprises one or more of: chemical etching, mechanical grinding, milling, or lasering.

4. The method of claim 1, further comprising covering the conductive tracks with a solder resist material.

5. The method of claim 1, wherein the electrically insulating mold compound comprises a laser-activatable mold compound, and wherein the forming conductive tracks comprises:
   applying a laser to the second surface of the encapsulant body thereby forming laser activated traces in the second surface of the encapsulant body; and
   performing a plating process that selectively forms the conductive tracks in the laser activated traces.

6. The method of claim 5, wherein performing the plating process comprises:
   performing an electroless plating process that forms seed layer parts of the conductive tracks; and
   performing an electroplating process that forms thicker metal layer parts of the conductive tracks on top of the seed layer parts, the thicker metal layer parts being thicker than the seed layer parts; and
   wherein the base section of the metal baseplate remains intact during the electroplating process.

7. The method of claim 1, wherein the forming conductive tracks comprises:
   laser assisted metal deposition; and
   ink jet metal printing.

8. The method of claim 1, further comprising:
   providing a first pad in a first area of the upper surface of the base section;
   providing a second pad in a second area of the upper surface of the base section, the second pad comprising metal;
   mounting the semiconductor die on the first pad; and
   mounting a second semiconductor die on the second pad,
   wherein after removing the base section the metal pad is exposed from the first surface of the encapsulant body and forms a thermal conduction path between an outer surface of the semiconductor package and the second semiconductor die.

9. The method of claim 8, wherein the first pad is an electrically insulating structure.

10. The method of claim 8, wherein the first pad is an electrically conductive structure.

11. The method of claim 8, wherein the semiconductor die is a logic device, wherein the second semiconductor die is a power switching device, and wherein the method further comprises electrically connecting a terminal of the semiconductor die to a terminal of the second semiconductor die.

12. The method of claim 1, wherein the metal baseplate is provided to comprise a metal trace on the upper surface of the base section, and wherein the metal trace contacts the metal posts.

13. The method of claim 12, wherein the metal baseplate is provided to comprise a die attach area on the upper surface of the metal baseplate, wherein the at least one metal trace extends between the die attach area and the metal posts, and wherein the semiconductor die is mounted on the die attach area such that one of the terminals of the semiconductor die faces and electrically connects with the metal trace.

14. The method of claim 12, wherein the metal trace is connected between a first one of the metal posts and a second one of the metal posts, wherein electrically connecting terminals of the semiconductor die to the metal posts comprises forming a conductive track in a second surface of the encapsulant body that is opposite from the first surface of the encapsulant body, and wherein the conductive track electrically connects one of the terminals of the semiconductor die to the first one of the metal posts.

15. The method of claim 1, further comprising forming a lead tip inspection feature of the semiconductor package, wherein forming the lead tip inspection feature comprises structuring the encapsulant body to form an exposed sidewall of one of the metal posts, and wherein the exposed sidewall extends completely between the first surface of the encapsulant body and a second surface of the encapsulant body that is opposite from the first surface.

16. The method of claim 15, wherein forming the lead tip inspection feature further comprises structuring the encapsulant body to form a second exposed sidewall of the one of the metal posts, wherein the second exposed sidewall extends completely between the first and second surfaces of the encapsulant body, and wherein the first and second exposed sidewalls form an angled intersection with one another.

17. The method of claim 1, further comprising:
providing a first pad that is electrically conductive on the upper surface of the base section, the first pad comprising a main pad portion and connectors that extend between the metal pad portion and at least one of the metal posts; and
mounting the semiconductor die on the main pad portion such that at least one of the terminals of the semiconductor die faces and is electrically connected to the main pad portion.

18. The method of claim 1, wherein electrically connecting terminals of the semiconductor die to the metal posts comprises a metal structuring process that is performed after forming the encapsulant body.

19. The method of claim 1, wherein the encapsulant body of electrically insulating mold compound is formed on the upper surface of the base section after mounting the semiconductor die on the upper surface of the metal baseplate and at least partly encapsulates the metal posts.

20. A method of forming a semiconductor package, the method comprising:
providing a metal baseplate comprising a base section and a plurality of metal posts, the base section being a planar pad of substantially uniform thickness, the plurality of metal posts each extending up from a planar upper surface of the base section;
mounting a semiconductor die on the upper surface of the metal baseplate;
forming an encapsulant body of electrically insulating mold compound on the upper surface of the base section;
electrically connecting terminals of the semiconductor die to the metal posts;
removing the base section so as to form package contacts from the metal posts at a first surface of the encapsulant body;
providing a first pad in a first area of the upper surface of the base section, wherein mounting the semiconductor die on the upper surface of the metal baseplate comprises mounting the semiconductor die on the first pad;
providing a second pad in a second area of the upper surface of the base section, the second pad comprising metal; and
mounting a second semiconductor die on the second pad, wherein after removing the base section the metal pad is exposed from the first surface of the encapsulant body and forms a thermal conduction path between an outer surface of the semiconductor package and the second semiconductor die.

* * * * *